United States Patent
Tsuji et al.

(10) Patent No.: US 9,012,035 B2
(45) Date of Patent: *Apr. 21, 2015

(54) ORGANIC ELECTROLUMINESCENCE DEVICE

(75) Inventors: Taishi Tsuji, Tsurugashima (JP); Shin Kawami, Tsurugashima (JP); Hideki Sato, Yokohama (JP); Masayoshi Yabe, Yokohama (JP)

(73) Assignees: Pioneer Corporation, Tokyo (JP); Mitsubishi Chemical Corporation, Tokyo (JP)

( * ) Notice: Subject to any disclaimer, the term of this patent is extended or adjusted under 35 U.S.C. 154(b) by 1736 days.

This patent is subject to a terminal disclaimer.

(21) Appl. No.: 12/096,844

(22) PCT Filed: Dec. 15, 2006

(86) PCT No.: PCT/JP2006/325098
§ 371 (c)(1),
(2), (4) Date: Dec. 5, 2008

(87) PCT Pub. No.: WO2007/069740
PCT Pub. Date: Jun. 21, 2007

(65) Prior Publication Data
US 2009/0184625 A1    Jul. 23, 2009

(30) Foreign Application Priority Data
Dec. 16, 2005 (JP) ................. P2005-363952

(51) Int. Cl.
*H01L 51/54* (2006.01)
*H01L 51/00* (2006.01)
*H05B 33/20* (2006.01)
*H01L 51/50* (2006.01)

(52) U.S. Cl.
CPC ........ *H01L 51/0067* (2013.01); *H01L 51/0072* (2013.01); *H01L 51/0085* (2013.01); *H01L 51/5012* (2013.01); *H01L 51/5048* (2013.01); *H05B 33/20* (2013.01); *Y10S 428/917* (2013.01)

(58) Field of Classification Search
CPC   H01L 51/0067; H01L 51/0072; C09K 11/06; C09K 2211/1018; C09K 2211/1074
USPC .......................................................... 548/440
See application file for complete search history.

(56) References Cited

U.S. PATENT DOCUMENTS

| | | | | |
|---|---|---|---|---|
| 2004/0086745 | A1* | 5/2004 | Iwakuma et al. | 428/690 |
| 2005/0127823 | A1* | 6/2005 | Iwakuma et al. | 313/504 |
| 2006/0186796 | A1* | 8/2006 | Yabe et al. | 313/504 |
| 2009/0236973 | A1* | 9/2009 | Yabe et al. | 313/504 |

FOREIGN PATENT DOCUMENTS

| | | | | |
|---|---|---|---|---|
| JP | 2001-313178 A | 11/2001 | | |
| JP | 2005-060382 A | 3/2005 | | |
| JP | 2005-203293 A | 7/2005 | | |
| JP | 2005-268199 A | 9/2005 | | |
| WO | WO 2005/022962 A1 * | 3/2005 | ............. | H05B 33/22 |
| WO | WO 2006/062062 A1 * | 6/2006 | ............. | H01L 51/50 |

* cited by examiner

*Primary Examiner* — Michael H Wilson
(74) *Attorney, Agent, or Firm* — Sughrue Mion, PLLC

(57) ABSTRACT

Disclosed is an organic electroluminescence device having a longer drive life. The organic electroluminescence device includes a light emitting layer which contains a luminescent dye and a host material having a nitrogen-containing aromatic heterocyclic ring. The luminescence resulting from the hole transport layer adjacent to the light emitting layer is less than one-hundredth of the luminescence resulting from the luminescent dye.

8 Claims, 4 Drawing Sheets

NORMALIZED EL SPECTRA OF DEVICE SAMPLES 1 AND 2

MAGNIFIED VIEW OF EL SPECTRA SHOWN IN FIG. 3

NORMALIZED EL SPECTRA OF DEVICE SAMPLES 3 TO 9

MAGNIFIED VIEW OF EL SPECTRA SHOWN IN FIG. 5

NORMALIZED EL SPECTRA OF DEVICE SAMPLES 10 TO 12

MAGNIFIED VIEW OF EL SPECTRA SHOWN IN FIG. 7

ORGANIC ELECTROLUMINESCENCE DEVICE

CROSS REFERENCE TO RELATED APPLICATIONS

This application is a National Stage of International Application No. PCT/JP2006/325098 filed on Dec. 15, 2006, claiming priority based on Japanese Patent Application No. 2005-363952, the contents of all of which are incorporated herein by reference in their entirety.

TECHNICAL FIELD

The present invention relates to an organic electroluminescence device (hereinafter, also referred to as organic EL device) utilizing electroluminescence (hereinafter, also referred to as EL) of an organic compound which emits light upon injection of electric current, and provided with a light emitting layer formed from such a material in a layer form.

BACKGROUND ART

In general, organic EL devices which constitute display panels using organic materials, have a structure in which an anode as a transparent electrode, a plurality of organic material layers including a light emitting layer, and a cathode composed of a metal electrode are successively laminated in the form of thin films, on a glass substrate which serves as a display surface.

The organic material layers include, in addition to the light emitting layer, those layers provided on the anode side of the light emitting layer and comprising materials that are capable of transporting holes, such as a hole injection layer and a hole transport layer, and those layers provided on the cathode side of the light emitting layer and comprising materials that are capable of transporting electrons, such as an electron transport layer and an electron injection layer, and the like. There have been suggested organic EL devices having configurations in which these layers are combined and provided in various manners.

When an electric field is applied to an organic EL device having organic material layers in the form of a laminate of a light emitting layer, an electron transport layer, a hole transport layer and the like, holes are injected from the anode, while electrons are injected from the cathode. The organic EL device makes use of the light emitted when these electrons and holes are recombined in the light emitting layer to form excitons, and these excitons return to the ground state. In order to obtain high luminescence efficiency or to drive the device stably, there are cases where a luminescent dye is doped into the light emitting layer as a guest material.

In recent years, it has been proposed to use phosphorescent materials, in addition to fluorescent materials, in the light emitting layer. It is conceived in the field of quantum physical chemistry that, statistically, the probability of occurrence of singlet exciton and that of triplet exciton after the recombination of an electron and a hole in the light emitting layer of an organic EL device, are in the ratio of 1:3. Therefore, in the case of using phosphorescence in which light emission involves return from the triplet state to the ground state, as compared to fluorescence in which light emission involves direct return from the singlet state to the ground state, it is expected to achieve a luminescence efficiency four-fold higher at the maximum than the luminescence efficiency achievable in the light emission mode of fluorescent luminescence. As the phosphorescent material, heavy metal complexes of platinum, iridium or the like may be mentioned, and it is suggested that phosphorescent luminescence at room temperature can be made possible by the heavy-element effect.

As such, organic electroluminescence devices are expected as light sources for full-color displays or illumination, and practical application of the devices is currently setting in. On the other hand, various improvements are being achieved for the organic electroluminescence devices in response to the requests for an increase in the drive life, reduction in power consumption, and the like.

For example, Patent Document 1 described below reports an organic electroluminescence device having an increased drive life, which uses an iridium complex as a luminescent dye and 4,4'-N,N'-dicarbazolebiphenyl (abbreviated to CBP) as a host material in the light emitting layer.

Patent Document 1: Japanese Unexamined Patent Publication No. JP-A No. 2001-313178

DISCLOSURE OF THE INVENTION

Problems to be Solved by the Invention

However, an increase in the drive life of organic electroluminescence devices has been a major theme to be addressed, and even further increase in the drive life is desired.

The present invention has been achieved in view of the above-described problem, and thus it is a main object of the present invention to provide an organic electroluminescence device having a longer drive life.

Means for Solving the Problems

The invention according to claim 1 relates to an organic electroluminescence device comprising, between a pair of electrodes composed of a cathode and an anode, a light emitting layer, a hole transport layer provided on the anode side of the light emitting layer, and an electron transport layer provided on the cathode side of the light emitting layer, wherein the light emitting layer comprises a luminescent dye, and a host material having a nitrogen-containing aromatic heterocyclic ring, and the luminescence intensity resulting from the hole transport layer adjacent to the light emitting layer is less than one-hundredth of the luminescence intensity resulting from the luminescent dye.

EXPLANATION OF REFERENCE NUMERALS

Figure 1:
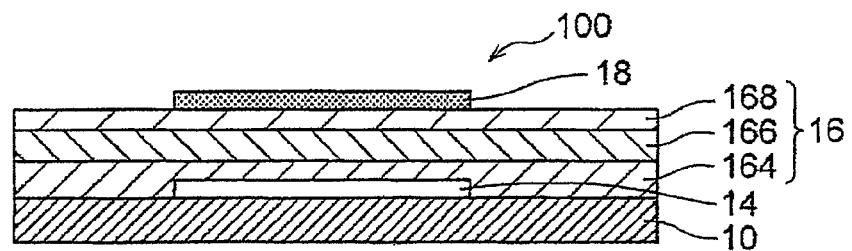
FIG. 1 is a cross-sectional view of an organic EL device according to an embodiment for detailed description of the present invention.

10 Substrate
14 Anode

16 Organic material layer
18 Cathode
100, 200 Organic EL device
162 Hole injection layer
164 Hole transport layer
166 Light emitting layer
168 Electron transport layer
170 Electron injection layer

BEST MODE FOR CARRYING OUT THE INVENTION

Under the purpose of improving the drive life of an organic electroluminescence device comprising, between a pair of electrodes such as a cathode and an anode, a light emitting layer, a hole transport layer provided on the anode side of the light emitting layer, and an electron transport layer provided on the cathode side of the light emitting layer, with the light emitting layer comprising a luminescent dye and a host material having a nitrogen-containing aromatic heterocyclic ring, the inventors of the present invention devotedly conducted an investigation on the relationship between the luminescence intensity resulting from the luminescent dye and the luminescence intensity originating the hole transport layer adjacent to the light emitting layer. As a result, the inventors found that when the luminescence resulting from the hole transport layer adjacent to the light emitting layer is adjusted to less than one-hundredth of the luminescence resulting from the luminescent dye, more holes can be certainly supplied to the light emitting layer, and thus it is possible to suppress deterioration due to reduction of the luminescent dye and deterioration due to reduction of the hole transport material, and deterioration due to oxidation or reduction of the host material, and to further increase the drive life of the organic EL device.

The inventors of the present invention discovered that there are available three methods as the method of adjusting the luminescence intensity resulting from the hole transport layer which is adjacent to the light emitting layer, to less than one-hundredth of the luminescence intensity resulting from the luminescent dye, which is the configuration for obtaining the above-described effects, such as (1) laminating a hole injection layer containing an electron accepting material between the anode and the hole transport layer, (2) adjusting the content of the luminescent dye in the light emitting layer to 6% by weight or more, and less than 100% by weight, and (3) establishing the relationship between the film thickness of the hole transport layer (film thickness=dH) and the film thickness of the electron transport layer (film thickness=dE) to satisfy that dH≤dE.

Hereinafter, embodiments of these three methods will be described with reference to the drawings.

In regard to the cases of (1) laminating a hole injection layer containing an electron accepting material between the anode and the hole transport layer, and (2) adjusting the content of the luminescent dye in the light emitting layer to 6% by weight or more, and less than 100% by weight.

First, the configuration of an organic EL device 100 including a light emitting layer 166, which is a featured aspect of the present invention, will be described.

The organic EL device 100 of the current embodiment has a configuration as shown in FIG. 1, in which, for example, at least an anode 14, organic material layers 16 and a cathode 18 are laminated on a transparent substrate 10 such as glass, while the organic material layers 16 are obtained by laminating a hole transport layer 164 comprising organic compounds, a light emitting layer 166 comprising organic compounds, and an electron transport layer 168 comprising organic compounds.

In the following, the light emitting layer 166, which is a featured aspect of the present invention in the organic EL device 100, will be described in detail.

The light emitting layer 166 is a layer for recombining transported holes and similarly transported electrons, and emitting light. The light emitting layer 166 has a film thickness of 5 nm to 3000 nm, and contains a luminescent dye and a host material. The content of the luminescent dye in the light emitting layer 166 is 6% by weight or more and less than 100% by weight, and more suitably 6% by weight or more and 20% by weight or less.

As for the luminescent dye and the host material, it is preferable that the first oxidation potential of the luminescent dye (ED+) is lower than the first oxidation potential of the host material (EH+), and the first reduction potential of the luminescent dye (ED−) is lower than the first reduction potential of the host material (EH−). Thus, the luminescent dye and the host material may be appropriately selected so that such properties are satisfied. The luminescent dye is suitably an organic metal complex represented by the following general formula (formula 1), and for example, $Ir(ppy)_3$ (formula 2) or the like can be employed.

[Formula 1]

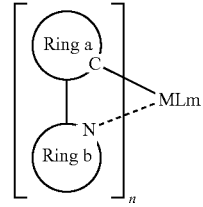

Formula 1 wherein M represents a metal, and m+n represents the valency of the metal. Examples of the metal include ruthenium, rhodium, palladium, silver, rhenium, osmium, iridium, platinum, gold and the like. m is an integer of 0 or greater, while n is an integer of 1 or greater. L represents a monovalent bidentate ligand. Ring a and ring b represent aromatic hydrocarbon groups which may be substituted.

[Formula 2]

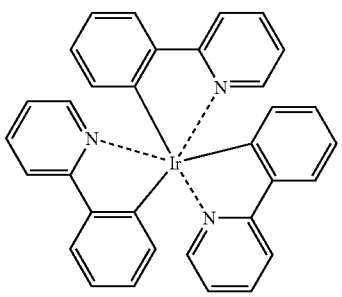

Formula 2

When the first oxidation potential of the luminescent dye (ED+) is lower than the first oxidation potential of the host material (EH+), and the first reduction potential of the luminescent dye (ED−) is lower than the first reduction potential of the host material (EH−), in the light emitting layer 166, holes that are carried mainly by the host material are smoothly captured by the luminescent dye which is in an electrically neutral state, and thus the luminescent dye efficiently pass into the cationic state. There can be a situation where the electrons propagated by the host material are supplied thereto. That is, the luminescent dye is not subject to electrical reduction in a neutral state, the luminescent dye does not enter an anionic state. Furthermore, it is not necessary for the host material to accumulate positive charges on the host molecules in vain, and the host material can carry electrons on an empty molecular orbit that is in an energy level even lower than the luminescent dye. Thereby, deterioration due to the reduction of the luminescent dye, and deterioration due to the oxidation or reduction of the host material can be suppressed.

The host material may employ a nitrogen-containing aromatic heterocyclic compound such as a pyridine compound. Furthermore, in addition to the nitrogen-containing aromatic heterocyclic compound, a carbazole compound may also be employed. It is more suitable that the host material is a compound having a carbazolyl group and a pyridine ring in the same molecule, as shown in the following general formula (formula 3 to formula 5).

[Formula 3]

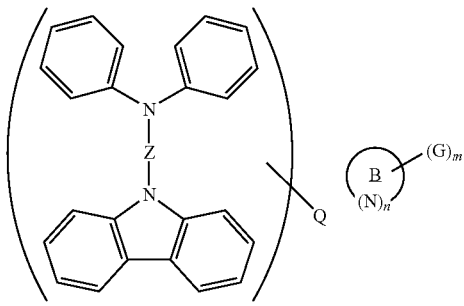

Formula 3 wherein Z represents a direct bond, or any linking group capable of conjugating the nitrogen atoms of the carbazole rings;

Q represents a direct bond linked to G;

B is a 6-membered aromatic heterocyclic ring having n units of N atoms as heteroatoms;

n is an integer from 1 to 3;

G binds to a C atom which is in a position ortho or para to the N atom of the ring B;

when G is linked to Q, G represents a direct bond or any linking group linked to Q;

when G is not linked to Q, G represents an aromatic hydrocarbon group;

a plurality of G's present in one molecule may be identical or different; and ring B may also have other substituents in addition to G.

[Formula 4]

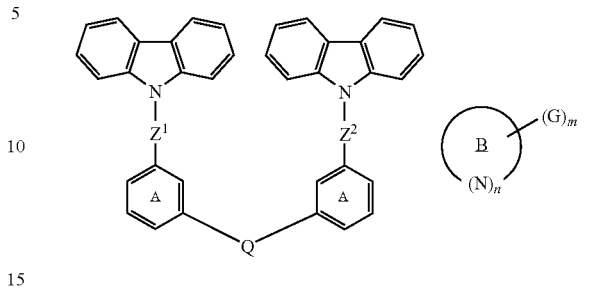

Formula 4 wherein Z1 and Z2 each represent a direct bond or any linking group;

Z1, Z2 and ring A may be substituted;

Z1 and Z2 may be identical or different;

Q represents a direct bond linked to G;

B is a 6-membered aromatic heterocyclic ring having n units of N atoms as heteroatoms;

G binds to a C atom which is in a position ortho or para to the N atom of the ring B;

when G is linked to Q, G represents a direct bond or any linking group linked to Q;

when G is not linked to Q, G represents an aromatic hydrocarbon group;

m is an integer from 3 to 5;

a plurality of G's present in one molecule may be identical or different; and ring B may also have other substituents in addition to G.

[Formula 5]

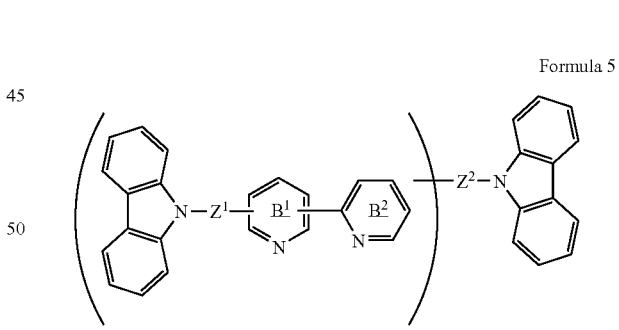

Formula 5 wherein Z1 and Z2 each represent a direct bond or any linking group, and Z1 and Z2 may be identical or different;

ring B1 and ring B2 are each a pyridine ring; and

Z1, Z2, ring B1 and ring B2 may be respectively substituted.

Specific examples thereof include the following compounds.

[Formula 6]
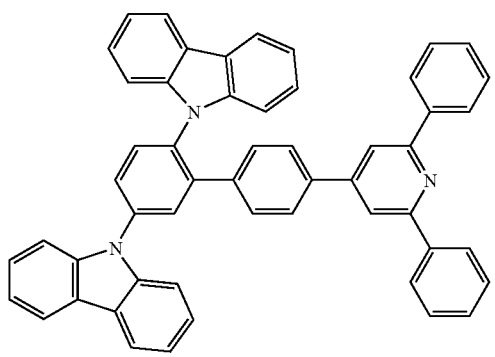
[Formula 7]
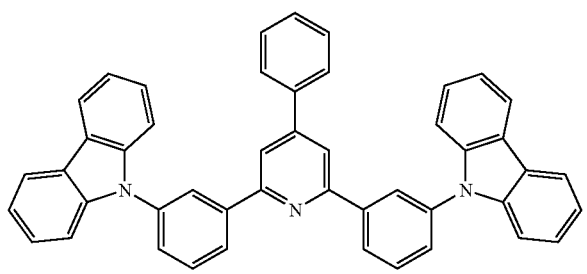
[Formula 8]
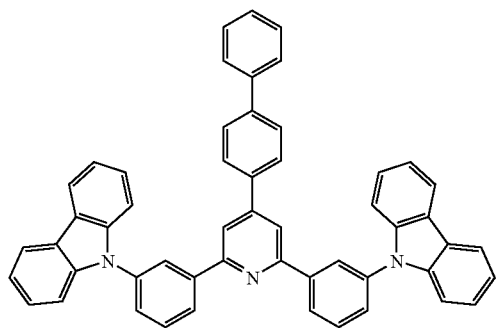
[Formula 9]
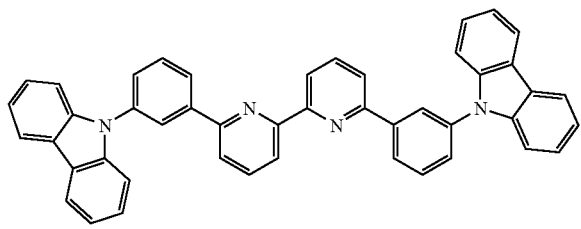
[Formula 10]
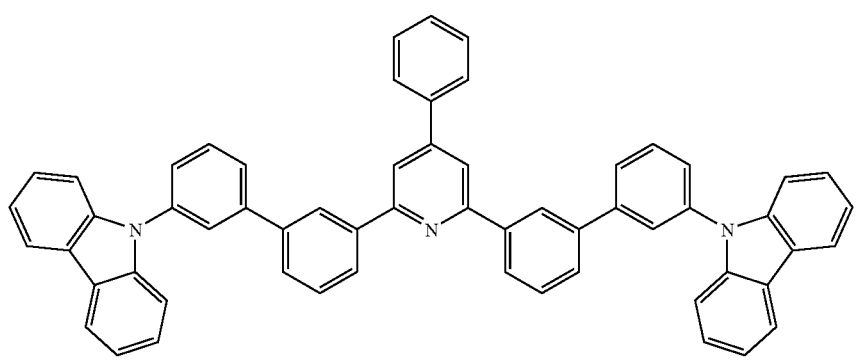
[Formula 11]
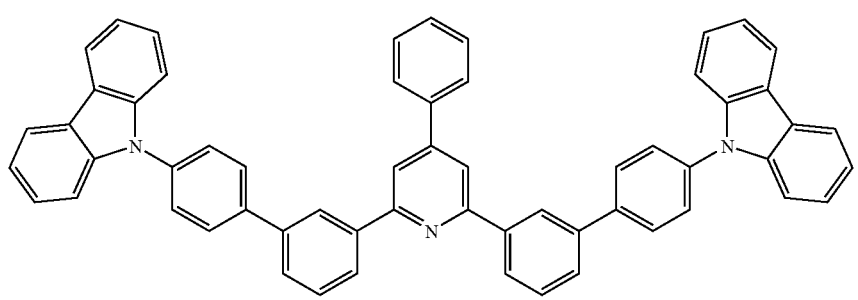

Next, the configuration of the organic EL device 100 excluding the light emitting layer 166 will be described.

As for the cathode 18, for example, an electrode comprising a metal having a small work function, such as aluminum, magnesium, indium, silver or various alloys, and having a thickness of approximately 10 nm to 500 nm, can be used, but any adequate material may be selected and used without being limited.

As for the anode 14, an electrode comprising an electrically conductive material having a large work function, such as indium tin oxide (hereinafter, referred to as ITO), and having a thickness of about 10 nm to 500 nm, or an electrode comprising gold and having a thickness of about 10 nm to 150 nm can be used, but any adequate material may be selected and used without being limited. Additionally, in the case of using gold as the electrode material, when formed into a thin film, the electrode becomes semi-transparent. It is preferable that at least one of the cathode 18 and the anode 14 is transparent or semi-transparent.

The hole transport layer 164 is a layer provided between the anode 14 (in the case of having a hole injection layer provided, the hole injection layer) and the light emitting layer 166, and promoting the transport of holes, and the layer has a function of appropriately transporting holes to the light emitting layer 166. The film thickness of the hole transport layer 164 is 5 nm to 3000 nm, and the layer is not limited to a single layer, but may be composed of a plurality of different materials. In the case where the hole transport layer consists of a plurality of layers, if the hole transport layer adjacent to the light emitting layer is designated as a first hole transport layer, and if the first hole transport layer, rather than the other constituent layers of the hole transport layer, is composed of a wide band gap hole transporting material having a low first reduction potential, confinement of the excitons generated in the light emitting layer 166 to within the light emitting layer 166 may be further promoted, and the efficiency may be enhanced.

As for the material of the hole transport layer 164, a material including a triarylamine compound may be suitable. As for the material, for example, NPB (formula 12) or the like can be employed.

[Formula 12]

Formula 12

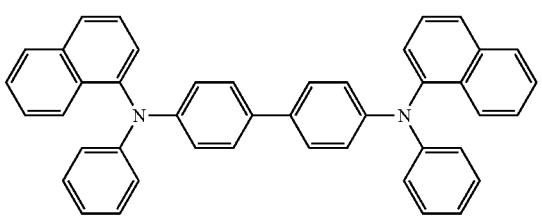

The electron transport layer 168 is a layer provided between the cathode 18 (in the case of having an electron injection layer provided, the electron injection layer) and the light emitting layer 166, and promoting the transport of electrons, and the layer has a function of appropriately transporting electrons to the light emitting layer 166. The film thickness of the electron transport layer 168 is 5 nm to 3000 nm, and the layer is not limited to a single layer, but may be composed of a plurality of different materials. In the case where the electron transport layer consists of a plurality of layers, if the electron transport layer adjacent to the light emitting layer is designated as a first electron transport layer, and if the first electron transport layer, rather than the other constituent layers of the electron transport layer, is composed of a wide band gap electron transporting material having a high first oxidation potential, confinement of the excitons generated in the light emitting layer 166 to within the light emitting layer may be further promoted, and the efficiency may be enhanced.

As for the material of the electron transport layer 168, a material including an organic aluminum complex compound may be suitable. For example, $Alq_3$ (formula 13) and BAlq (formula 14) can be employed, but the material is not limited to these.

[Formula 13]

Formula 13

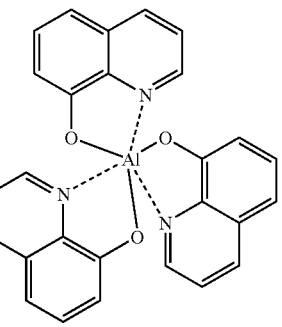

[Formula 14]

Formula 14

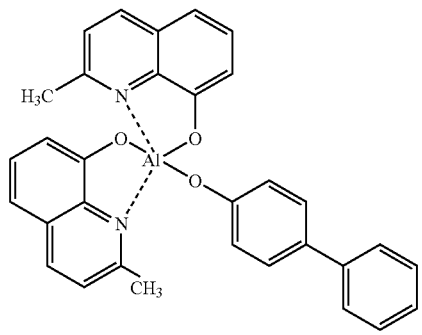

The first oxidation potential of the luminescent dye (ED+), the first oxidation potential of the host material (EH+), the first reduction potential of the luminescent dye (ED−), the first reduction potential of the host material (EH−), and the oxidation reduction potentials of the material of the electron transport layer and the like, can be determined by electrochemical measurement.

The method of electrochemical measurement will be discussed. A material to be measured is dissolved to a concentration of about 0.1 to 2 mM in an organic solvent containing about 0.1 mol/l of tetrabutylammonium perchlorate, tetrabutylammonium hexafluorophosphate or the like as a supporting electrolyte, and a glassy carbon electrode is used as a working electrode, a platinum electrode is used as a counter electrode, while a silver electrode is used as a reference electrode. The material to be measured is oxidized-reduced at the working electrode, and this potential thus measured is compared with the oxidation reduction potential of a reference material such as ferrocene, to thereby calculate the oxidation reduction potential of the material to be measured.

As an example, the oxidation reduction potentials of $Ir(ppy)_3$, the compounds of formulas 6 to 11, $Alq_3$, BAlq and CBP measured by the above-described method are summarized in Table 1.

TABLE 1

Oxidation reduction potential of various compounds

| Compound | First oxidation potential v vs SCE | First reduction potential v vs SCE |
|---|---|---|
| Ir(ppy)$_3$ | 0.72 | −2.30 |
| Formula 6 | 1.33 | −2.03 |
| Formula 7 | 1.26 | −2.02 |
| Formula 8 | 1.24 | −1.95 |
| Formula 9 | 1.29 | −2.05 |
| Formula 10 | 1.30 | −2.09 |
| Formula 11 | 1.26 | −2.08 |
| Alq$_3$ | 1.14 | −1.89 |
| BAlq | 1.02 | −1.97 |
| CBP | 1.27 | −2.40 |

Additionally, in the present embodiment, although the configuration of the organic material layers 16 is exemplified by a structure including the hole transport layer 164/light emitting layer 166/electron transport layer 168, but is not limited to this structure, and a structure will be acceptable as long as it includes at least the hole transport layer 164/light emitting layer 166/electron transport layer 168. For example, an electron injection layer comprising an alkali metal compound such as LiF may also be formed between the electron transport layer 168 and the cathode 18. Furthermore, a hole injection layer of a porphyrin compound such as copper phthalocyanine (CuPc), a triarylamine compound or the like is laminated as a thin film to form a film, between the anode 14 and the hole transport layer 164. The hole injection layer preferably includes an electron accepting compound, and the film thickness is suitably 5 nm to 3000 nm.

The electron accepting compound is preferably a compound having an oxidizing power and having an ability to accept one electron from a hole transporting compound such as a triarylamine compound, and specifically, the electron accepting compound is preferably a compound having an electron affinity of 4 eV or greater, while a compound having an electron affinity of 5 eV is more preferred.

For example, an onium salt substituted with an organic group, such as 4-isopropyl-4'-methyldiphenyliodonium tetrakis(pentafluorophenyl)borate, iron(III) chloride (JP-A No. 11-251067), a high valent inorganic compound such as ammonium peroxodisulfate, a cyano compound such as tetracyanoethylene, an aromatic boron compound such as tris(pentafluorophenyl) borane (JP-A No. 2003-31365), a fullerene derivative, iodine and the like may be mentioned.

Among the compounds described above, from the viewpoint of strong oxidizing power, an onium salt substituted with an organic group and a high valent inorganic compound are preferred, while from the viewpoint of being soluble in various solvents and applicable by wet coating, an onium salt substituted with an organic group, a cyano compound and an aromatic boron compound are preferred. As discussed above, by taking such constitution as described above, it becomes possible to provide an organic electroluminescence device having a longer drive life.

In regard to the case of (3) establishing the relationship between the film thickness of the hole transport layer (film thickness=dH) and the film thickness of the electron transport layer (film thickness=dE) to satisfy that dH≤dE.

Hereinafter, a detailed explanation will be given for a feature of the present invention, but those parts having similarity to the explanations for (1) and (2) will be omitted.

The case is characterized in that the film thickness of the light emitting layer 166 (dM) is 5 nm to 3000 nm, and that the relationship between the film thickness of the electron transport layer (film thickness=dE; 5 nm to 3000 nm) and the film thickness of the hole transport layer (film thickness=dH; 5 nm to 3000 nm) is such that dH≤dE.

The hole transport layer 164 is a layer provided between the anode 14 (in the case of having a hole injection layer provided, the hole injection layer) and the light emitting layer 166, and promoting the transport of holes, and the hole transport layer has a function of appropriately transporting holes to the light emitting layer 166. The film thickness of the hole transport layer 164, dH, is 5 nm to 3000 nm, and it is necessary to set the film thickness such that the relationship between the film thickness of the hole transport layer and the film thickness of the electron transport layer 168, dE, satisfies that dH≤dE. Suitably, the film thickness of the hole transport layer 164, dH, and/or the film thickness of the electron transport layer 168, dE, is suitably 5 nm to 500 nm.

It is suitable to set the film thickness such that the relationship between the film thickness of the hole transport layer 164, dH, and the film thickness of the light emitting layer 166, dM, satisfies that dH≤dM.

The light emitting layer 166 is a layer for recombining transported holes and similarly transported electrons, to induce fluorescent light emission and/or phosphorescent light emission. The light emitting layer 166 has a film thickness dM of 5 nm to 3000 nm, and contains a luminescent dye and a host material.

The electron transport layer 168 is a layer provided between the anode 18 (in the case of having an electron injection layer provided, the electron injection layer) and the light emitting layer 166, and promoting the transport of electrons, and the electron transport layer has a function of appropriately transporting electrons to the light emitting layer 166. The film thickness of the electron transport layer 168, dE, is 5 nm to 3000 nm, and the film thickness is set such that the relationship between the electron transport layer and the hole transport layer 164, dH, satisfies that dH≤dE.

The hole injection layer may be laminated between the anode and the hole transport layer, and the hole injection layer may include an electron accepting material. The film thickness of the hole injection layer is suitably 5 nm to 3000 nm.

As discussed above, by taking such constitution as described above, it becomes possible to provide an organic electroluminescence device having a longer drive life.

EXAMPLES

Example with regard to (1) laminating a hole injection layer containing an electron accepting material between the anode and the hole transport layer, (2) adjusting the content of the luminescent dye in the light emitting layer to 6% by weight or more and less than 100% by weight.

Example 1

Figure 2:
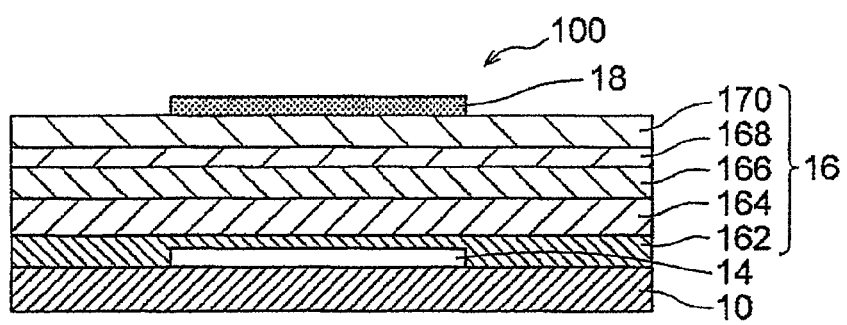
FIG. 2 is a cross-sectional view of the organic EL device according to Example 1.

Specifically, a number of sample organic EL devices were fabricated, and their drive lives were evaluated. In each of the samples, as shown in FIG. 2, films of materials were successively formed on an ITO (film thickness 110 nm) anode 14 on a glass substrate 10, to thus fabricate an organic EL device of the following constitution.

A coating solution prepared by dissolving in ethyl benzoate an aromatic diamine-containing polyether represented by formula 15 (weight average molecular weight 26,900) at a concentration of 2% by weight and an electron accepting material represented by formula 16 at a concentration of 0.4% by weight, was added dropwise on an ITO anode 14, and spin coating was performed under the conditions of a speed of rotation of 1500 rpm for 30 seconds, to form a hole injection layer 162. After calcining the assembly at 200° C. for 15 minutes, the film thickness was 30 nm. Subsequently, a film of NPB was formed by vacuum deposition, and thus a hole transport layer 164 having a film thickness of 40 nm was formed. Further, Ir(ppy)$_3$ of the formula 2 as a luminescent dye and the compound of the formula 8 as a host material were used, and a light emitting layer having a thickness of 40 nm was formed by co-vacuum deposition. At that time, the content of Ir(ppy)$_3$, the luminescent dye, in the light emitting layer 166 was adjusted to 5.5% by weight. Furthermore, LiF was deposited on the electron transport layer 168 as an electron injection layer 170, to a film thickness of 1 nm, and aluminum (Al) was laminated thereon to a film thickness of 100 nm as a cathode 18. Thus, an organic EL device sample 1 as shown in FIG. 2 was fabricated.

Comparative Example 1

An organic EL device sample 2 was fabricated in the same manner as in Example 1, except that instead of the aromatic diamine-containing polyether, a film of copper phthalocyanine (CuPc) was formed by vacuum deposition, to obtain a hole injection layer 162 having a film thickness of 25 nm.

(Comparison Experiment of Samples 1 and 2, and Results Thereof)

Figure 3:
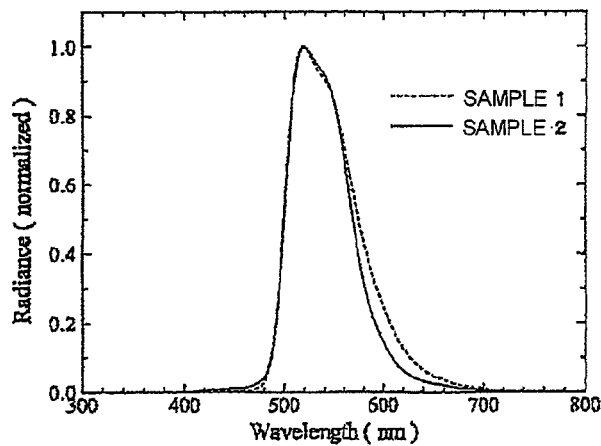
FIG. 3 is a diagram showing normalized EL spectra of device samples 1 and 2.
Figure 4:
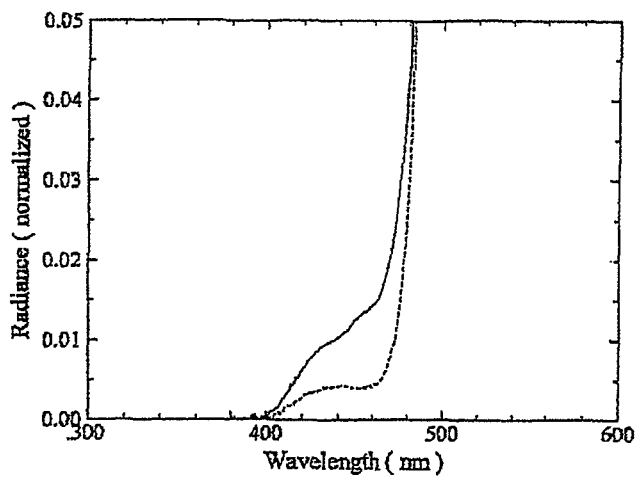
FIG. 4 is a magnified view of the EL spectra shown in FIG. 3.

The device samples 1 and 2 were driven at a current density of 2.5 MA/cm$^2$, and measurement of EL spectra was performed. In the measurement of the EL spectra, a spectroradiometer CS-1000A (Konika Minolta Corp.) was used. The measured EL spectra are shown in FIG. 3 and FIG. 4. By this measurement, the peak intensity ratio of the luminescence resulting from NPB which was a hole transport layer 164

[Formula 15]

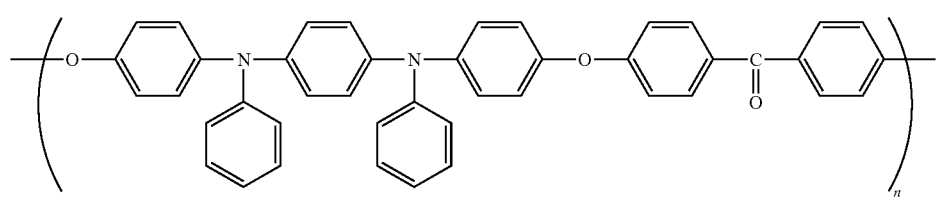

Formula 15

[Formula 16]

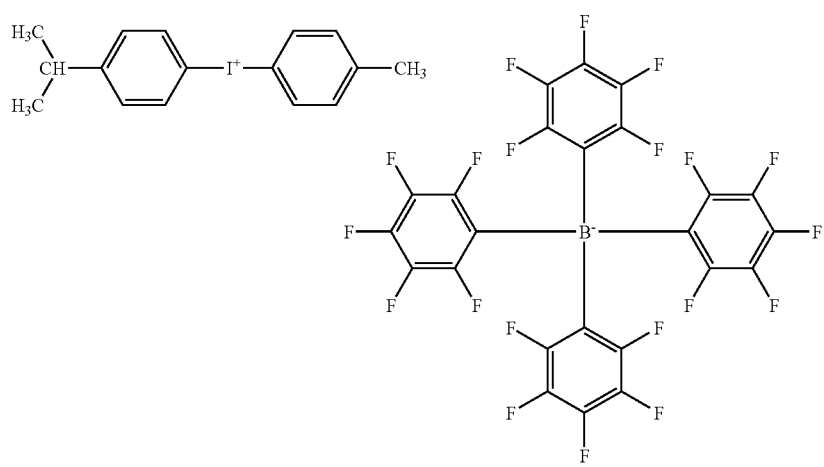

Formula 16 adjacent to the light emitting layer 166, to the luminescence resulting from Ir(ppy)$_3$ which was the luminescent dye, was determined.

Then, the device sample was subjected to continuous driving at a current density of 7 mA/cm$^2$, and the time taken for the luminance to decrease to 50% of the value at the initiation of measurement, was measured.

These measurement results are summarized in Table 2.

TABLE 2

Measurement of luminescence peak intensity ratios of device samples, and results of continuous drive test

| Device | Luminescence peak intensity ratio NPB/Ir(ppy)$_3$ | Evaluation of drive life | |
|---|---|---|---|
| | | Initial luminance (cd/m$^2$) | Time for 50% decrease in luminance (hours) |
| Sample 1 (Example) | 0.004 | 2499 | 4766 |
| Sample 2 (Comparative Example) | 0.01 | 2439 | 2810 |

As can be seen from Table 2, in the device sample 1 of the Example, the luminescence resulting from NPB is suppressed, and the drive life is improved, compared to the device sample 2 of the Comparative Example. The device sample 1 uses an aromatic diamine-containing polyether including an electron accepting material as the hole injection layer. Thus, the density of holes in the hole injection layer is increased, and a state in which more holes are easily supplied to the light emitting layer, is achieved. Thereby, in the light emitting layer 166, the holes that are carried mainly by the host material are captured by the luminescent dye which is in an electrically neutral state, thus the luminescent dye passing into the cationic state, and then a state in which the electrons propagated by the host material are supplied can be certainly achieved. Therefore, it is conceived that deterioration due to reduction of the luminescent dye, and deterioration due to oxidation or reduction of the host material can be suppressed, and an increase in the drive life can be achieved.

Example 2

An organic EL device sample was fabricated in the same manner as in Example 1, except that the deposition rate for Ir(ppy)$_3$, the luminescent dye, was changed, and the content of Ir(ppy)$_3$ in the light emitting layer 166 was set to 6% by weight (device sample 3), 7.5% by weight (device sample 4), 9% by weight (device sample 5), 10.5% by weight (device sample 6) or 12% by weight (device sample 7).

Comparative Example 2

An organic EL device sample was fabricated in the same manner as in Example 1, except that the deposition rate for Ir(ppy)$_3$, the luminescent dye, was changed, and the content of Ir(ppy)$_3$ in the light emitting layer 166 was set to 3% by weight (device sample 8) or 4.5% by weight (device sample 9).

(Comparison Experiment of Samples 3 to 9, and Results Thereof)

Figure 5:
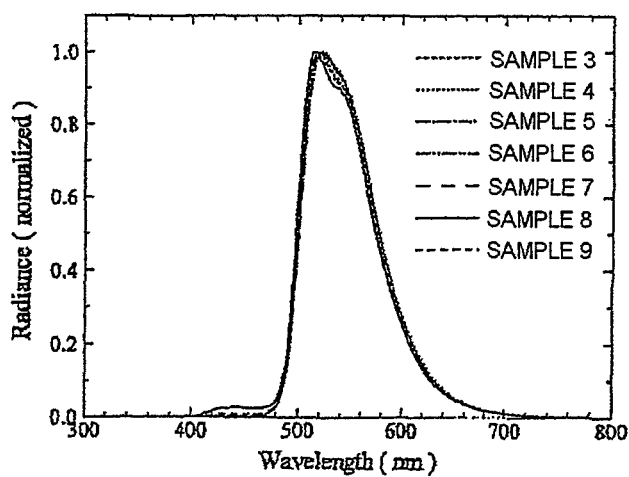
FIG. 5 is a diagram showing normalized EL spectra of device samples 3 to 9.
Figure 6:
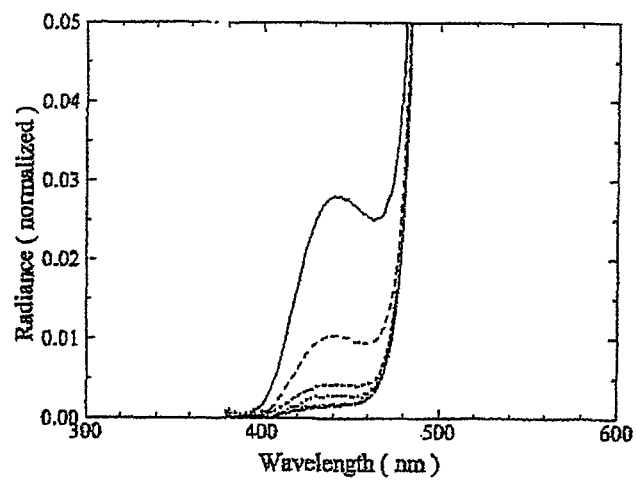
FIG. 6 is a magnified view of the EL spectra shown in FIG. 5.

The device samples 3 to 9 were driven at a current density of 2.5 mA/cm$^2$, and measurement of EL spectra was performed. In the measurement of the EL spectra, a spectroradiometer CS-1000A (Konika Minolta Corp.) was used. The measured EL spectra are shown in FIG. 5 and FIG. 6. By this measurement, the peak intensity ratio of the luminescence resulting from NPB which was a hole transport layer 164 adjacent to the light emitting layer 166, to the luminescence resulting from Ir(ppy)$_3$ which was the luminescent dye, was determined.

Then, each of the device samples was subjected to continuous driving at a current density of 10 mA/cm$^2$, and the time taken for the luminance to decrease to 50% of the value at the initiation of measurement, was measured.

These measurement results are summarized in Table 3.

TABLE 3

Measurement of Ir(ppy)$_3$ content and luminescence peak intensity ratios of device samples, and results of continuous drive test

| Device | Ir(ppy)$_3$ content (% by weight) | Luminescence peak intensity ratio NPB/Ir(ppy)$_3$ | Evaluation of drive life | |
|---|---|---|---|---|
| | | | Initial luminance (cd/m$^2$) | Time for 50% decrease in luminance (hours) |
| Sample 3 (Example) | 6 | 0.004 | 3097 | 2860 |
| Sample 4 (Example) | 7.5 | 0.003 | 3290 | 2980 |
| Sample 5 (Example) | 9 | 0.002 | 3246 | 3030 |
| Sample 6 (Example) | 10.5 | 0.002 | 2784 | 3290 |
| Sample 7 (Example) | 12 | 0.002 | 2182 | 3510 |
| Sample 8 (Comparative Example) | 3 | 0.028 | 1800 | 1800 |
| Sample 9 (Comparative Example) | 4.5 | 0.01 | 2295 | 2300 |

As can be seen from Table 3, in the device samples 3 to 7 of the Example, the luminescence resulting from NPB is suppressed, and the drive life is improved, compared to the device samples 8 and 9 of the Comparative Example. Since the organic metal complex represented by Ir(ppy)$_3$ has hole transportability, when the content of Ir(ppy)$_3$ in the light emitting layer was set to 6% by weight or more, a state in which more holes are more easily supplied from the hole transport layer to the light emitting layer, is achieved. Thereby, in the light emitting layer 166, holes that are carried mainly by the host material are captured by the luminescent dye which is in an electrically neutral state, thus the luminescent dye passing into the cationic state, and then a state in which the electrons propagated by the host material are supplied can be certainly achieved. Therefore, it is conceived that deterioration due to reduction of the luminescent dye, and deterioration due to oxidation or reduction of the host material can be suppressed, and an increase in the drive life can be achieved.

Patent Document 1 shows that when the content of Ir(ppy)$_3$ is diluted to 0.5% by weight, the drive life is further improved. The host material in the light emitting layer of the Example of Patent Document 1 is CBP. In the case of using CBP as the host material in the light emitting layer, since CBP has high hole transportability, it is indispensable to insert a hole blocking layer on the cathode side adjacently to the light emitting layer, from the viewpoint of increasing the efficiency of the device. The hole blocking layer is generally composed of a material having a high first oxidation potential and very high electron transportability. However, due to the high electron transportability, the presence of holes in the hole blocking layer is not allowed, and it is conceived that when holes have intruded into the layer, deterioration of the material itself occurs. On the other hand, since an organic metal complex such as Ir(ppy)$_3$ has hole transportability as described above, it is conceived that it is desirable to achieve a state in which excess holes are not supplied from the hole transport layer into the light emitting layer, from the viewpoint of increasing the drive life.

As such, since the device configuration disclosed by the present invention and the device configuration disclosed in Patent Invention 1 have different mechanisms for the deterioration of device in terms of driving, the effect of the content of the organic metal complex in the light emitting layer on the drive life becomes different in the two configurations.

According to the present Example as described above, an organic electroluminescence (EL) device having a longer drive life can be obtained.

Example with regard to (3) establishing the relationship between the film thickness of the hole transport layer (film thickness=dH) and the film thickness of the electron transport layer (film thickness=dE) to satisfy that dH≤dE Example 3 and Comparative Example 3

Specifically, a number of sample organic EL devices were fabricated, and their drive lives were evaluated. In each of the samples, as shown in FIG. 7, films of materials were successively formed on an ITO (film thickness 110 nm) anode 14 on a substrate, to thus fabricate an organic EL device 200 of the following constitution.

Figure 7:
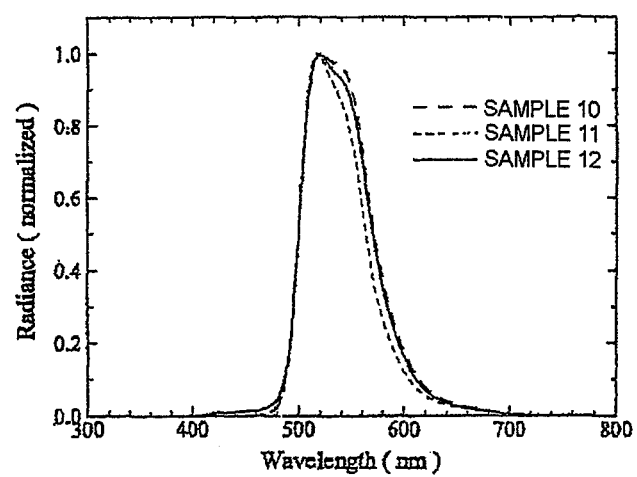
FIG. 7 is a diagram showing normalized EL spectra of device samples 10 to 12.
Figure 8:
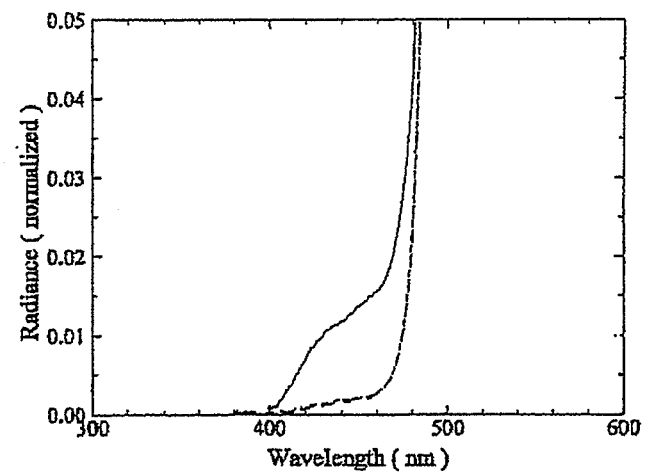
FIG. 8 is a magnified view of the EL spectra shown in FIG. 7.
Figure 9:
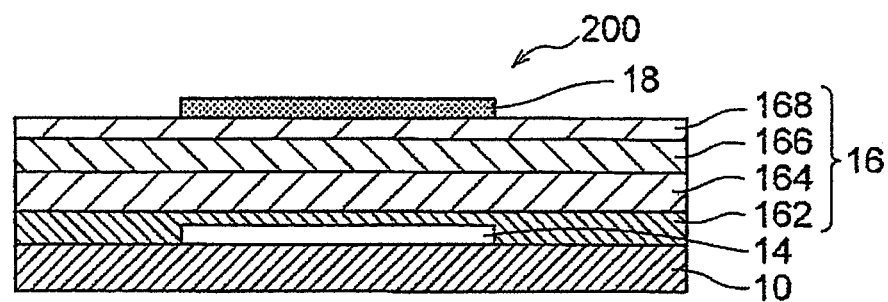
FIG. 9 is a cross-sectional view of the organic EL device according to Example 3.

Organic material layers were laminated as shown in FIG. 7, using copper phthalocyanine (CuPc) (respective film thickness 25 nm) in the hole injection layer 162, using NPB in the hole transport layer 164, using the compound of the formula 8 as the host material in the light emitting layer 166, with 5.5% by weight of Ir(ppy)$_3$ represented by the formula 2 added as the luminescent dye, and using Alq$_3$ in the electron transport layer 168. At that time, the respective film thicknesses of the hole transport layer 164, the light emitting layer 166 and the electron transport layer 168 were varied as shown in Table 4.

The device sample 10 and the device sample 11 correspond to the Example of the present invention, while the device sample 12 corresponds to the Comparative Example. Furthermore, an organic EL device 200 was respectively fabricated by depositing LiF on the electron transport layer 168 as the electron injection layer 170 to a film thickness of 1 nm, and laminating aluminum (Al) thereon as the cathode to a film thickness of 100 nm.

(Comparison Experiment of Samples 10, 11 and 12, and Results Thereof)

The devices samples were subjected to continuous driving at a current density of 7 mA/cm$^2$, and the time taken for the luminance to decrease to 50% of the value of immediately after the initiation of measurement, was measured.

These measurement results are summarized in Table 4.

TABLE 4

| | Film thickness (nm) | | | Luminescence | Evaluation of drive life | |
| --- | --- | --- | --- | --- | --- | --- |
| | | | | | | Time for 50% |
| Device | Hole transport layer | Light emitting layer | Electron transport layer | peak intensity ratio NPB/Ir(ppy)$_3$ | Initial luminance (cd/m$^2$) | decrease in luminance (hours) |
| Sample 10 (Example) | 20 | 40 | 40 | 0.002 | 2377 | 6182 |
| Sample 11 (Example) | 10 | 40 | 40 | 0.002 | 1434 | 6744 |
| Sample 1 (Comparative Example) | 40 | 40 | 20 | 0.01 | 2439 | 2810 |

As can be seen from Table 4, the device samples 10 and 11 of the Example are improved in the drive life, compared to the device sample 12 of the Comparative Example.

When the relationship between the film thickness of the hole transport layer (film thickness=dH) and the film thickness of the electron transport layer (film thickness=dE) is established to satisfy that dH≤dE, since the moving distance of holes can be shortened, a state in which more holes are easily supplied to the light emitting layer, can be achieved. Thereby, in the light emitting layer 166, holes that are carried mainly by the host material are captured by the luminescent dye which is in an electrically neutral state, thus the luminescent dye passing into the cationic state, and then a state in which the electrons propagated by the host material are supplied can be certainly achieved. Therefore, it is conceived that deterioration due to reduction of the luminescent dye, and deterioration due to oxidation or reduction of the host material can be suppressed, and an increase in the drive life can be achieved.

As discussed above, according to the present Example, an organic electroluminescence (EL) device having a longer drive life can be obtained.

The invention claimed is:

1. An organic electroluminescence device comprising, between a pair of electrodes composed of a cathode and an anode, a light emitting layer, a hole transport layer provided on the anode side of the light emitting layer, and an electron transport layer provided on the cathode side of the light emitting layer,
wherein the light emitting layer comprises a luminescent dye, and a host material,
the luminescence intensity resulting from the hole transport layer adjacent to the light emitting layer is less than one-hundredth of the luminescence intensity resulting from the luminescent dye, and
the host material is a compound represented by one of the following Formulas 3 and 5:

Formula 3

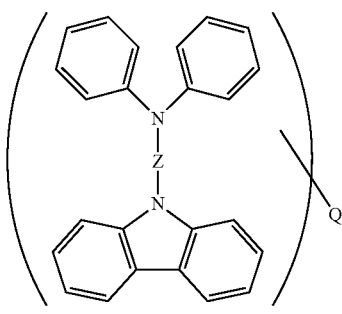
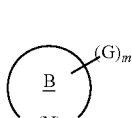

wherein Z represents a direct bond, or a linking group capable of conjugating the nitrogen atoms of the carbazole and amine groups;
Q represents a direct bond linked to G;
B is a 6-membered aromatic heterocyclic ring having n units of N atoms as heteroatoms;
n is an integer from 1 to 3;
m is an integer from 3 to 5;
G binds to a C atom which is in a position ortho or para to the N atom of the ring B;
when G is linked to Q, G represents a direct bond or a linking group linked to Q;
when G is not linked to Q, G represents an aromatic hydrocarbon group;
a plurality of G's present in one molecule may be identical or different; and
ring B may also have other substituents in addition to G, Formula 5

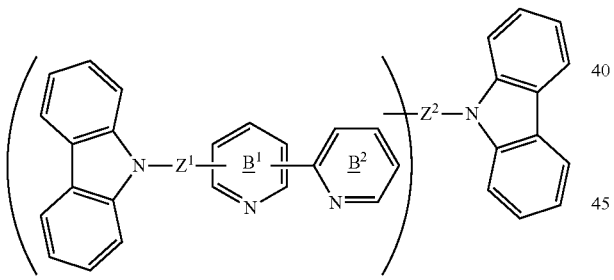

wherein $Z^1$ and $Z^2$ each represent a direct bond or a linking group, and $Z^1$ and $Z^2$ may be identical or different;
ring $B^1$ and ring $B^2$ are each a pyridine ring; and
$Z^1$, $Z^2$, ring $B^1$ and ring $B^2$ may be respectively substituted.

2. The organic electroluminescence device according to claim 1,
wherein the content of the luminescent dye in the light emitting layer is 6% by weight or more, and less than 100% by weight.

3. The organic electroluminescence device according to claim 1,
wherein the first oxidation potential of the luminescent dye (ED+) is lower than the first oxidation potential of the host material (EH+), and
the first reduction potential of the luminescent dye (ED−) is lower than the first reduction potential of the host material (EH−).

4. The organic electroluminescence device according to claim 1,
wherein the luminescent dye is an organic metal complex represented by the following Formula 1:

[Formula 1]

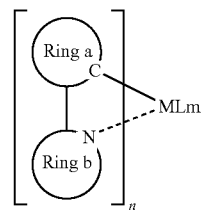

Formula 1 wherein M is one selected from the group consisting of ruthenium, rhodium, palladium, silver, rhenium, osmium, iridium, platinum, and gold;
L represents a monovalent bidentate ligand;
Ring a and Ring b each represent an aromatic hydrocarbon group which may be substituted; and
m+n represents the valency of M, wherein m is an integer of 0 or greater, while n is an integer of 1 or greater.

5. An organic electroluminescence device comprising, between a pair of electrodes composed of a cathode and an anode, a light emitting layer, a hole transport layer provided on the anode side of the light emitting layer, and an electron transport layer provided on the cathode side of the light emitting layer, wherein the light emitting layer comprises a luminescent dye, and a host material,
the luminescence intensity resulting from the hole transport layer adjacent to the light emitting layer is less than one-hundredth of the luminescence intensity resulting from the luminescent dye, and
the host material is a compound represented by one of the following Formulas 6 to 11:

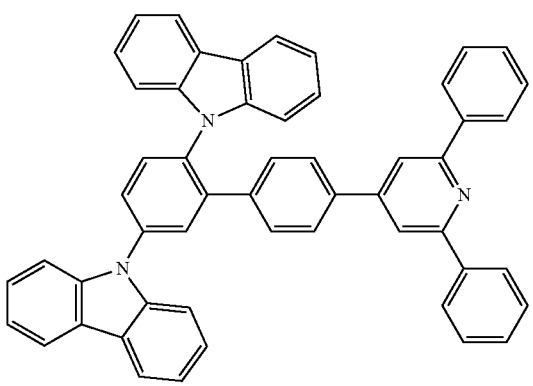

Formula 6

-continued

Formula 7

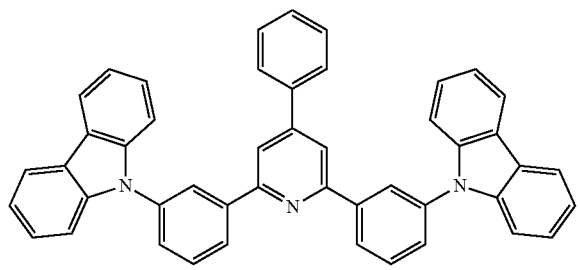

Formula 8

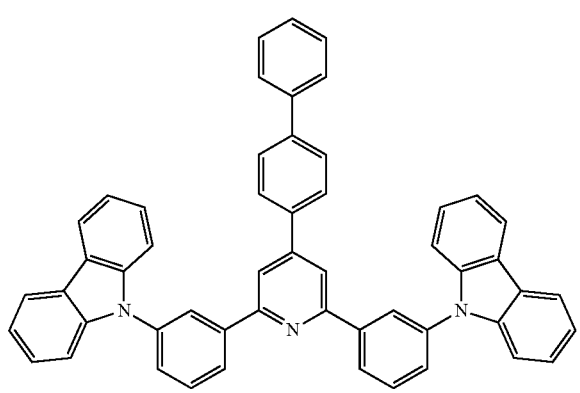

Formula 9

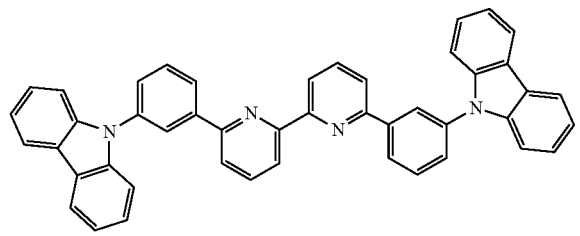

Formula 10

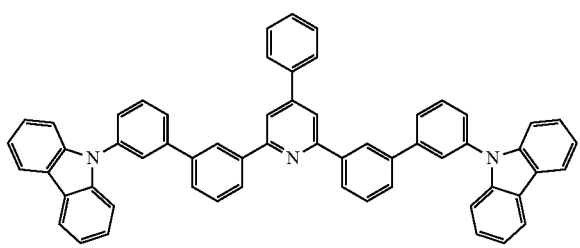

-continued

Formula 11

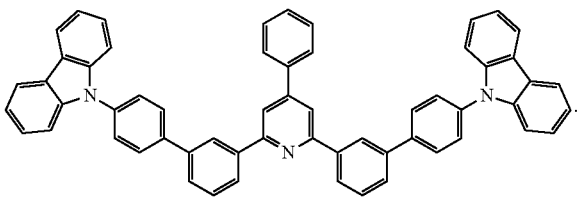

6. The organic electroluminescence device according to claim 5, wherein the content of the luminescent dye in the light emitting layer is 6% by weight or more, and less than 100% by weight.

7. The organic electroluminescence device according to claim 5,
wherein the first oxidation potential of the luminescent dye (ED+) is lower than the first oxidation potential of the host material (EH+), and
the first reduction, potential of the luminescent dye (ED−) is lower than the first reduction potential of the host material (EH−).

8. The organic electroluminescence device according to claim 5, wherein the luminescent dye is an organic metal complex represented by the following Formula 1:

Formula 1

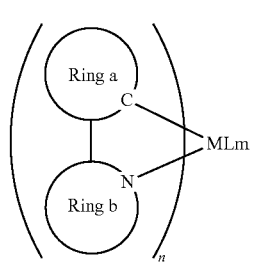

wherein M is any one selected from the group consisting of ruthenium, rhodium, palladium, silver, rhenium, osmium, iridium, platinum, and gold;
L represents a monovalent bidentate ligand;
Ring a and Ring b each represent an aromatic hydrocarbon group which may be substituted; and
m+n represents the valency of M, and m is an integer of 0 or greater, while n is an integer of 1 or greater.

* * * * *